United States Patent
Köhler et al.

(10) Patent No.: US 6,683,728 B2
(45) Date of Patent: Jan. 27, 2004

(54) ILLUMINATION SYSTEM WITH REDUCED ENERGY LOADING

(75) Inventors: Jess Köhler, Oberkochen (DE); Alexander Sohmer, Oberkochen (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 220 days.

(21) Appl. No.: 09/969,398

(22) Filed: Oct. 1, 2001

(65) Prior Publication Data

US 2002/0163737 A1 Nov. 7, 2002

(30) Foreign Application Priority Data

Mar. 20, 2001 (DE) .......................... 101 13 613

(51) Int. Cl.[7] .......................... G02B 3/00; G02B 27/10; G03B 27/54; G03B 21/16
(52) U.S. Cl. ....................... 359/649; 359/619; 359/627; 355/67; 353/52
(58) Field of Search .................. 359/618, 619, 359/620, 627, 649; 353/52; 355/67

(56) References Cited

U.S. PATENT DOCUMENTS

| | | | | |
|---|---|---|---|---|
| 4,939,630 A | * | 7/1990 | Kikuchi et al. | ................ 355/67 |
| 5,675,401 A | * | 10/1997 | Wangler et al. | ................ 355/67 |
| 5,982,558 A | | 11/1999 | Fürter et al. | ................ 359/649 |
| 6,236,449 B1 | * | 5/2001 | Tanitsu | .......................... 355/67 |
| 6,285,443 B1 | * | 9/2001 | Wangler et al. | ................ 355/67 |
| 2001/0017692 A1 | * | 8/2001 | Tanitsu | .......................... 359/708 |
| 2002/0163737 A1 | * | 11/2002 | Kohler et al. | ................... 355/67 |

FOREIGN PATENT DOCUMENTS

| | | | | |
|---|---|---|---|---|
| DE | 44 20 053 A1 | 6/1994 | .......... | G02B/19/00 |
| DE | 44 41 974 A1 | 11/1994 | .......... | G02B/19/00 |
| DE | 195 20 563 A1 | 6/1996 | .......... | G03F/7/20 |
| DE | 196 53 983 A1 | 12/1996 | .......... | G02B/13/24 |
| DE | 199 12 464 A1 | 3/1999 | .......... | G03F/7/20 |
| DE | 199 42 281 A1 | 9/1999 | .......... | G02B/13/18 |

* cited by examiner

Primary Examiner—David N. Spector

(57) ABSTRACT

An illumination system having a rod integrator and an objective for imaging an object field onto an image field, which has an entry surface, an exit surface, and reflecting side surfaces. A lens-free interspace with an axial size of at least 30 mm is in the objective. A plane within this interspace is optically conjugate to the plane of the entry surface. All rays starting from a central field within the entry surface that are not reflected at the side surfaces have smaller ray heights in the lens-free interspace in relation to the optical axis than all the rays starting from the central field that are reflected at the side surfaces; the ratio of the field width to the width of the entry surface is at most 0.7. The ratio of the field height to the height of the entry surface is at most 0.7.

21 Claims, 8 Drawing Sheets

ILLUMINATION SYSTEM WITH REDUCED ENERGY LOADING

CROSS-REFERENCE TO RELATED APPLICATIONS

U.S. patent application Ser. No. 09/125,621 is fully incorporated by reference into the present application.

STATEMENT REGARDING FEDERALLY SPONSORED RESEARCH OR DEVELOPMENT

Not applicable.

REFERENCE TO A MICROFICHE APPENDIX

Not applicable.

BACKGROUND OF THE INVENTION

1. Field of the Invention

The invention relates to an illumination system, in particular for a microlithographic projection exposure apparatus, having a rod integrator, having an entry surface, and an exit surface; an objective for imaging an object field, the objective being arranged after the rod integrator in the direction of light propagation.

2. Technical Field

An exposure system of this kind is known from U.S. Pat. No. 6,285,443.

The illumination system is constructed along an optical axis and comprises a rod integrator, followed in the direction of light propagation by an objective that images an object field onto an image field.

In the illumination system of U.S. Pat. No. 6,285,443, the entry surface of the rod integrator is illuminated by a light incoupling optics. The rod integrator, of inside reflection type integrator, for example a glass rod or a hollow lightguide, mixes and homogenizes the incident ray bundle by multiple internal reflection, so that a nearly homogeneous intensity distribution is produced at the exit surface of the rod integrator. A masking device is situated in the neighborhood of the exit surface of the rod integrator, and is imaged by a following objective, a so-called REMA (Reticle Masking) objective, onto a structure-carrying mask, the so-called reticle, whereby the illuminated region on the reticle is sharply bounded. A further illumination system with a glass rod and a following REMA objective is known from U.S. Pat. No. 5,675,401.

German Patent Documents DE 199 12 464 A1 likewise describes an illumination system with a rod integrator. The exit surface of the rod integrator is imaged on the reticle by means of an objective.

The documents cited above do not, however, contain any teaching regarding a specific embodiment of the objective, which is respectively arranged after the rod integrator.

Embodiments of REMA objectives are shown in U.S. Pat. No. 5,982,558 and German Patent Document DE 196 53 983 A1 (U.S. patent application Ser. No. 09/125,624). These documents also show projection exposure apparatuses with a glass rod as a rod integrator and a following REMA objective.

BRIEF SUMMARY OF THE INVENTION

The invention has as its object to provide an improved illumination system with a rod integrator and a following objective, in particular the energy load on the lenses within the objective being reduced in the system.

This object is attained with an illumination system. The illumination system has a rod integrator having an entry surface and an exit surface and an objective for imaging an object field onto an image field, the objective being arranged after the rod integrator in a direction of light propagation. A lens-free interspace is situated in the objective. A plane optically conjugate to a plane of the entry surface is situated within the lens-free interspace. The lens-free interspace has an axial length along the optical axis of at least 30 mm. Within the interspace, first rays have first ray heights with respect to the optical axis. The first rays are not reflected at the side surfaces of the rod integrator. Second rays have second ray heights with respect to the optical axis, and are reflected at the side surfaces of the rod integrator. The first ray heights have lower absolute values than the second ray heights. All of the first rays and all of the second rays start from a central field within the entry surface of the rod integrator. The central field has a field width and a field height. The ratio of the field width to the width of the entry surface is at most 0.7, and the ratio of the field height to the height of the entry surface is at most 0.7.

The energy load on the lenses of the objective is reduced by providing the objective with a lens-free interspace, the position and the axial size of the lens-free interspace primarily depending on the dimensions of the rod integrator. The rod integrator has an entry surface and an exit surface, with a width and a height and four side surfaces with a length along the optical axis. The entry surface is not limited to a rectangular cross section. It can also have a polygonal external shape, where the cross section of the entry surface can be inscribed in a respective rectangle having a width and a height. In this case, the rod integrator has more than four side surfaces. The rod integrator can be constructed from plural rod integrators that follow one another in direct succession. It is also possible to install a deflecting mirror or a deflecting prism between the individual rod integrators. The length of the rod integrator is then given by the sum of the individual lengths of the combined rod integrators.

As a development of the invention, there is within the objective a plane that is conjugate to the plane of the entry surface. Images of the entry surface arise in this plane. The number of images depends on the number of reflections of the rays within the rod integrator. This plane conjugate to the plane of the entry surface is situated within the lens-free interspace, which preferably has an axial size of at least 30 mm, and in particular at least 50 mm. As a development of the invention, the plane conjugate to the plane of the entry surface is advantageously situated nearly in the middle of the lens-free interspace.

As a further development of the invention, the position and size of the lens-free interspace is determined as follows. Rays within the illumination system are considered that start from the entry surface of the rod integrator and are conducted through the illumination system. Rays that pass through the rod integrator without reflection at the side surfaces, and rays that are reflected one or plural times at the side surfaces, are differentiated here. There is a region within the objective in which the rays that are not reflected have a smaller ray height than the rays that are reflected one or more times. This region defines the lens-free interspace. The ray heights here indicate the distance of the rays to the optical axis. For the determination of the lens-free interspace, not all the rays that are possible in principle are considered, but only those rays that start from a central field in the entry surface of the rod integrator. The field width of the central field then amounts to at most 70% of the width of the entry surface, in particular, at most 50% of the width of the entry surface. The field height of the central field is at most 70% of the height of the entry surface, in particular, at most 50% of the height of the entry surface. The smaller the central field from which the rays for the determination of the lens-free interspace start, the more extended is the lens-free interspace. The central field thus does not limit the illuminated region on the entry surface, but gives the place of origin of the rays, which are taken into consideration for determination of the lens-free interspace.

The interspace is lens-free when, within the interspace, there is no surface vertex of a lens on the optical axis. The lens-free interspace has a gas filling with air, an inert gas, or a mixture of inert gases, or can be evacuated.

As a further development of the invention, local intensity peaks that arise within the objective in an illumination system with a rod integrator and the following objective do not lead to any materials damage. The local intensity peaks occur within the lens-free interspace when the light is coupled into the rod integrator in as loss-free a manner as possible. For this purpose, the optical components arranged before the rod integrator produce a constriction of the ray bundle, a so-called secondary light source, near the entry surface of the rod integrator. The lateral extent of the real secondary light source is, preferably, smaller than the cross section of the entry surface. A grid of virtual secondary light sources is produced in the plane of the real secondary light source by the multiple reflections within the rod integrator, the rays of a virtual light source respectively undergoing an equal number of reflections at the side surfaces of the rod integrator. The grid period of the virtual secondary light source in the x-direction is equal to the width of the entry surface, and in the y-direction is equal to the height of the entry surface, the width being measured in the x-direction and the height in the y-direction. Since the real secondary light source does not completely fill the corresponding grid cell in the middle of the grid, the virtual grid cells are also not completely illuminated. The grid of the virtual secondary light sources is imaged by the lenses of the objective that follows the rod integrator onto a grid with real tertiary light sources, the position of which within the objective primarily depends on the length of the rod integrator. The grid with the tertiary light sources is then situated near to the plane optically conjugate to the plane of the entry surface. If the grid with the secondary light sources is produced directly in the plane of the entry surface, the grid with the tertiary light sources is then situated in the plane optically conjugate to the plane of the entry surface. Large fluctuations of intensity occur in the plane with the tertiary light sources, with local intensity peaks occurring at the place of the tertiary light sources. This connection between the rod integrator and the local energy load of the lenses of a following objective was not considered in the embodiments of a REMA objective known from, inter alia, U.S. Pat. No. 5,982,558 and DE 196 53 983 A1 (U.S. patent application Ser. No. 09/125,621).

As a further development of the invention, the objective is constructed such that the grid with the tertiary light sources is situated within the lens-free interspace. The determination of the position of the lens-free interspace takes place according to the invention, in that the plane that is optically conjugate to the plane of the entry surface of the rod integrator is determined within the objective, or according to the invention, with the aid of selected rays. The rays that are taken into account for the determination of the lens-free interspace and are not reflected at the side surfaces of the rod integrator belong to the central tertiary light source, while the rays reflected one or more times belong to the off-axis tertiary light sources. By means of the lens-free interspace, the result is attained that outside the interspace the ratio of the intensities of the local intensity maxima determined by the tertiary light sources to the intensities of the local intensity minima situated therebetween is smaller than 2.0, when starting from a central secondary light source that fills the central grid cell to the extent of 50%.

As a further development of the invention, the lens-free interspace has a length along the optical axis of at least 30 mm, and in particular at least 50 mm, so that the surface vertices of the lenses arranged before and after the interspace have at least this separation.

It is particularly difficult to introduce an interspace of this size within the objective when the objective has a large object field and a large numerical aperture. Thus the diameter of the object field of the objective is between 15 mm and 40 mm and the object-side numerical aperture is between 0.4 and 0.75. The object-side numerical aperture here represents the aperture that is bounded by the maximum aperture diaphragm diameter of the objective. In order to transfer this large entendue value, or Helmholtz-LaGrange invariant, which results from the product of the diameter of the object field and the object-side numerical aperture, a large number of lenses is necessary. It is precisely with the lenses in the region of the aperture plane that the spherical aberrations are corrected, so that the lenses usually follow one another directly in this region.

The grid with the tertiary light sources is however situated, with the rod integrators usually used, in the region of the lens group near the aperture plane, in which lens group the chief ray starting from the outermost object point has smaller ray heights than the marginal ray that starts from an object point on the optical axis and whose ray angle corresponds to the maximum object-side aperture.

To introduce a lens-free interspace of such a width into this lens group near the aperture plane can only be justified by the advantage of a reduction of the energy load on the lenses. An alternative solution would be to construct lenses from radiation-resistant material that are arranged in the region of the tertiary light sources. For wavelengths of 193 nm or 157 nm, however, only fluoride crystals such as, for example, $CaF_2$ or $MgF_2$ are available, and these are expensive and costly to process.

The distance of the plane with the virtual secondary light sources from the object plane of the following objective is equal to the sum of the distance of the real secondary light source from the entry surface of the rod integrator, the length of the rod integrator, and a possible defocusing of the object plane of the objective from the exit surface of the rod integrator. The distance of the real secondary light source from the entry surface and the defocusing can however be neglected in comparison with the length of the rod integrator. The length of the rod integrator is chosen so that a predetermined uniformity of the distribution of illumination results within the object field, and is usually better than 5%, in particular better than 1%. This is attained when the rays entering the rod integrator are reflected 1.5 times to 4.5 times on average. A greater number of reflections would admittedly increase the uniformity, but at a given aperture would lead to a greater rod length and thereby worsen the transmission of the rod integrator. Moreover, the constructional space required for the illumination system would be increased. The number of reflections in a rod integrator depends on the length $L_{RI}$, the cross section of the entry surface, and the maximum entry angle of the rays. The sine of the maximum entry angle is given by the product of the filling factor σ and the maximum object-side numerical aperture $NA_{Obj}$, divided by the refractive index $n_{RI}$ of the rod integrator, which is equal to the refractive index of the gas filling for a hollow lightguide and equal to the refractive index of the rod material for a glass rod. The filling factor σ indicates the ratio of the sine of the maximum angle of the rays before the rod integrator to the object-side numerical aperture of the objective. The filling factor σ can be varied between 0.2 and 1.0, for example, by means of the optical components arranged before the rod integrator. Thus the maximum ray angle at the entry surface of the rod integrator varies between 20% and 100% of the maximum object-side numerical aperture $NA_{Obj}$ of the objective. Since the number or reflections is likewise smaller for smaller ray angles, the rod length required for uniformity must be matched to the minimum possible filling factor σ. The rectangular entry surface of the rod integrator has a side aspect ratio $R_{xy}$ of width to height between 1 and 5. The width $B_{RI}$ of the entry surface advantageously results from the diameter $D_{Obj}$ of the objective according to the following relation:

$$0.8 \cdot Du_{Obj} \cdot \sqrt{1+\frac{1}{R_{xy}^2}} < B_{SI} < 1.2 \cdot Du_{Obj} \cdot \sqrt{1+\frac{1}{R_{xy}^2}} \quad (1)$$

The limits 0.8 and 1.2 give tolerances that arise based on the decentering of the rod integrator with respect to the object plane of the objective. It is ensured by the relation (1) with the narrow limits for the width of the entry surface that on the one hand the object field of the objective is optimally utilized, and on the other hand that light coupled in to the rod integrator passes nearly completely through the object field of the objective. In relation to the number of reflections required for uniformity, the greater dimension of the entry surface, in this case the width $B_{RI}$, is relevant, since a ray that is incident in the x-z plane undergoes a smaller number of reflections that a ray that is incident in the y-z plane. The width $B_{RI}$ is measured here in the x-direction and the height in the y-direction. From the known quantities for an illumination system, the range of values for the length $L_{RI}$ of the rod integrator can be derived according to the following relation:

$$1.5 \cdot \frac{B_{SI}}{\tan\left(\arcsin\left(\frac{NA_{Obj} \cdot \sigma}{n_{SI}}\right)\right)} < L_{SI} < 4.5 \cdot \frac{B_{SI}}{\tan\left(\arcsin\left(\frac{NA_{Obj} \cdot \sigma}{n_{SI}}\right)\right)} \quad (2)$$

For objectives whose object field diameter is in the range of 25 mm to 35 mm and whose object-side numerical aperture is between 0.6 and 0.75, the rod integrators preferably have a length between 350 mm and 800 mm.

Due to the multiple reflections within the rod integrator, the average rays of the ray bundles run nearly parallel to the optical axis after the rod integrator. It is therefore advantageous for the entrance pupil of the following objective to be situated at infinity.

While the entrance pupil situated at infinity of the following objective is imaged on the aperture plane by the lenses arranged between the object plane and the stop plane, the grid with the tertiary light sources comes to be situated after the aperture plane in the direction of light propagation, since the grid with the secondary light sources has a finite distance to the object plane. The distance between the stop plane and the grid with the tertiary light sources can become so large that it is advantageous if a lens group with at least a first lens is arranged between the aperture plane and the lens-free interspace. It is thereby possible, on the one hand to position lenses near to the stop plane for the correction of spherical aberrations, and on the other hand to reduce, with the lens-free interspace, the energy load on the lenses in the neighborhood of the tertiary light sources.

The said first lens is to be arranged as near as possible to the aperture plane. It is preferred that the distance of the said first lens from the stop plane is smaller than 30 mm, and in particular smaller than 10 mm. The distance in this case is measured between the aperture plane and the surface vertex of the said first lens facing toward the stop plane.

In order to reduce the number of lenses, and thus to provide the possibility of an extended lens-free interspace, it is advantageous if the first lens has an aspheric lens surface. The main contribution to spherical aberration can be corrected by the aspheric surface near the stop.

As a further development of the invention, a single lens in the lens group between the aperture plane and the lens-free interspace is sufficient to provide the required contribution to the correction of the spherical aberrations.

With rod integrators with a large side aspect ratio of the entry surface of at least 2:1, in particular 3:1, and particularly preferred 4:1, expensive optical components are required in order to match the shape of the real secondary light source to the grid cell given by the extent of the entry surface. If the central grid cell is only partially illuminated, for example only to 50%, large intensity fluctuations occur at the place of the grid with the tertiary light sources. As a further development of the invention, the invention can be used with rod integrators with a large side aspect ratio, in which it is expensive and difficult to completely illuminate the central grid cell.

The imaging performance of the objective can be measured by the quality of a spot image within the image field. A spot image then represents the image of an object point, where the ray bundle starting from the object point respectively has the maximum object-side numerical aperture. In the objectives according to the invention, the diameters of all spot images are a maximum of 1% of the diameter of the image field. The correction means to attain this imaging performance are known, for example, from U.S. Pat. No. 5,982,558 and German Patent Document DE 196 53 983 A1 (U.S. patent application Ser. No. 09/125,621), which is fully incorporated by reference into the present application. The invention now states that, notwithstanding this good imaging performance and the associated expensive correction, it is possible to provide a lens-free interspace in the region of the stop plane. For example, by the arrangement of at least one lens between the aperture plane and the lens-free interspace, and also by means of the use of an aspheric lens surface in this lens. The objective then advantageously has a magnification of three to eight times, in particular, a magnification of three to five times.

As a further development of the invention, a further use of the invention is in connection with excimer lasers as light sources at a wavelength smaller than 250 nm. At these wavelengths, in particular at a wavelength of 193 nm or 157 nm, materials damage, for example, solarization of the material, results due to large local intensity loads. Moreover pulsed light sources are concerned, so that the radiation is given by single light pulses of high power. This is a high load for the lens material, especially at these low wavelengths with high-energy photons.

If there is the reticle of a projection exposure apparatus in the image plane of the objective, it is a further development of the invention that the size of the illuminated region on the reticle can be varied. This is attained in that a masking device with movable field stops, so-called REMA blades, is arranged after the rod integrator in the object plane of the objective, the so-called REMA objective, and is imaged on the reticle by the REMA objective.

The illumination system with rod integrator and REMA objective is advantageously a component of a microlithographic projection exposure apparatus, where a projection objective images the reticle onto a photosensitive substrate. The exit pupil of the REMA objective is then matched to the entrance pupil of the following projection objective.

BRIEF DESCRIPTION OF THE DRAWINGS

The invention will be described in more detail with reference to the accompanying drawings.

DETAILED DESCRIPTION OF THE INVENTION

Figure 1:
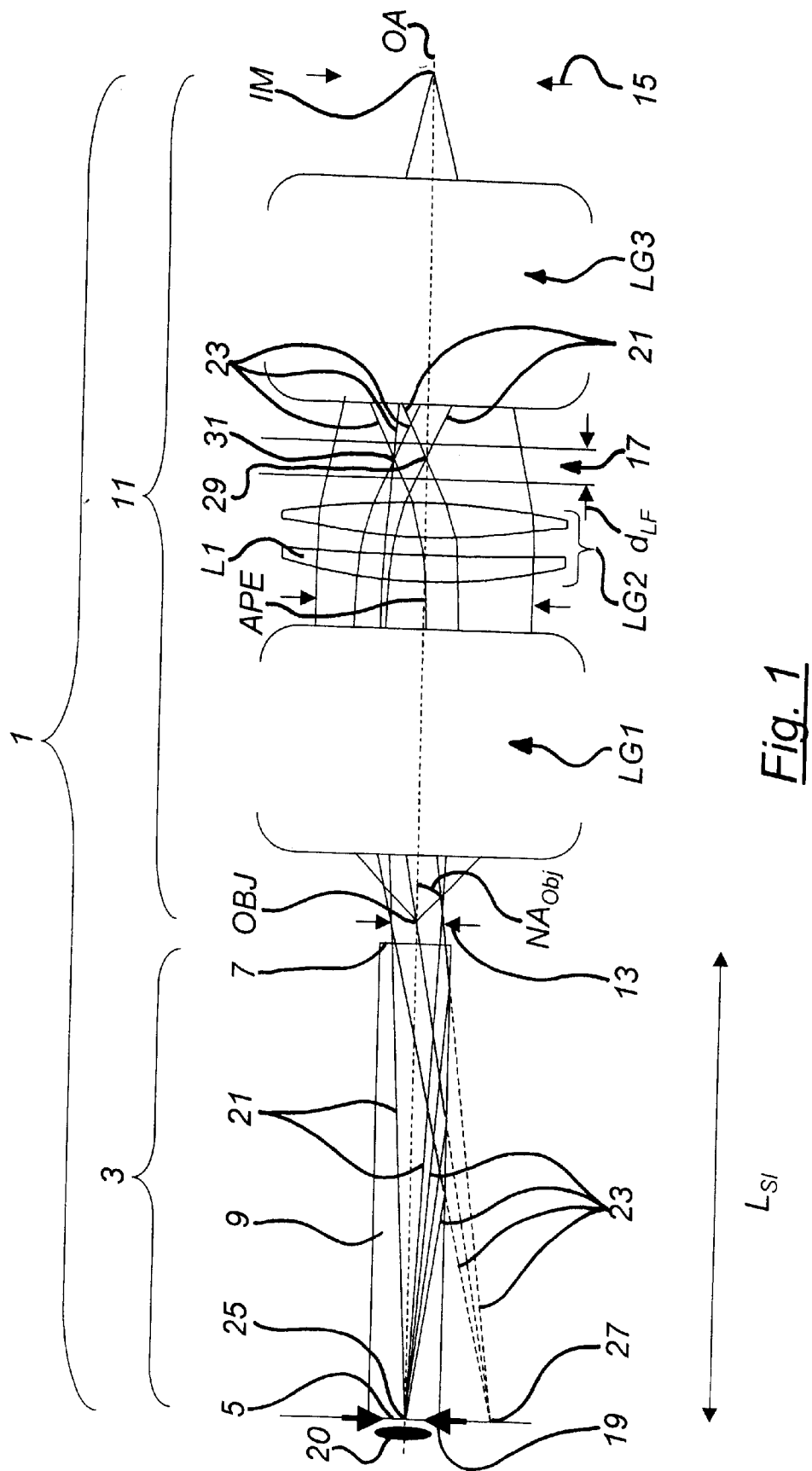
FIG. 1 shows a schematic diagram of an illumination system according to the invention.

The illumination system 1 according to the invention is shown schematically in FIG. 1. It comprises the rod integrator 3 and the following objective 11. The rod integrator 3, for example a hollow lightguide or a glass rod, has the rectangular entry surface 5 and the exit surface 7, and also the four side surfaces 9. The object plane OBJ of the objective 11 follows at a distance of 0–2 mm from the exit surface 7. The objective 11 images the object field 13 into the image field 15 situated in the image plane IM. It consists of the lens group LG1 that images the entrance pupil situated at infinity onto the stop plane APE, and the lens groups LG2 and LG3 that are arranged between the aperture plane APE and the image plane IM. The lens group LG2 has at least the lens L1. The lens-free interspace 17 according to the invention is situated between the lens groups LG2 and LG3. To determine it, rays are considered that start from the real secondary light source 20, which is produced in the region of the entry surface 5 of the rod integrator 3. Rays 21 that are not reflected at the side surfaces 9 of the rod integrator 3, and rays 23 that are reflected one or more times at the side surfaces 9, are thereby differentiated. Virtual images of the real secondary light source 20 are produced in the plane of the real secondary light source by the multiple reflections within the rod integrator 3, so that a grid with virtual secondary light sources arises. Only the central secondary light source 25, reduced to a point in the diagram, and the virtual secondary light source 27, are drawn in. The rays 21 that are not reflected at the side surfaces 9 start from the central secondary light source 25. The rays 23, which are reflected once at the side surfaces 9 start from the virtual light source 27. They are drawn dashed from the secondary light source 27 up to the reflection point on the side surface 9, since virtual rays are concerned. The real rays belonging to the virtual light source 27 and starting from the real secondary light source 20 are likewise drawn in. While the entrance pupil situated at infinity of the objective 11 is imaged on the aperture plane APE, the plane conjugate to the plane of the secondary light sources with the tertiary light sources is situated between the stop plane APE and the image plane IM within the lens-free interspace 17. The images of the secondary light sources 25 and 27, and thus the tertiary light sources 29 and 31, are drawn in. Since real images are concerned, the intensity maxima at the place of the tertiary light sources could lead to materials damage if optical elements were present in the lens-free interspace 17. For the determination of the lens-free interspace 17, the ray heights of the rays 21 that start from the central secondary light source 25, and the ray heights of the rays 23 that start from the off-axis secondary light source 27, are considered. In the region of the lens-free interspace 17, the rays 21 have smaller ray heights than the rays 23. For the determination of the axial size $d_{LF}$ of the lens-free interspace 17, all the rays are considered that pass through a central field 19 in the entry surface 5, the field width of the central field 19 being 50% of the width of the entry surface 5 and the field height, 50% of the height of the entry surface 5. Since, therefore, further rays are considered besides the drawn-in rays that exclusively start from the optical axis OA, the axial size $d_{LF}$ of the lens-free interspace 17 in FIG. 1 is smaller than this would be expected to be on the basis of the drawn-in rays.

Figure 2:
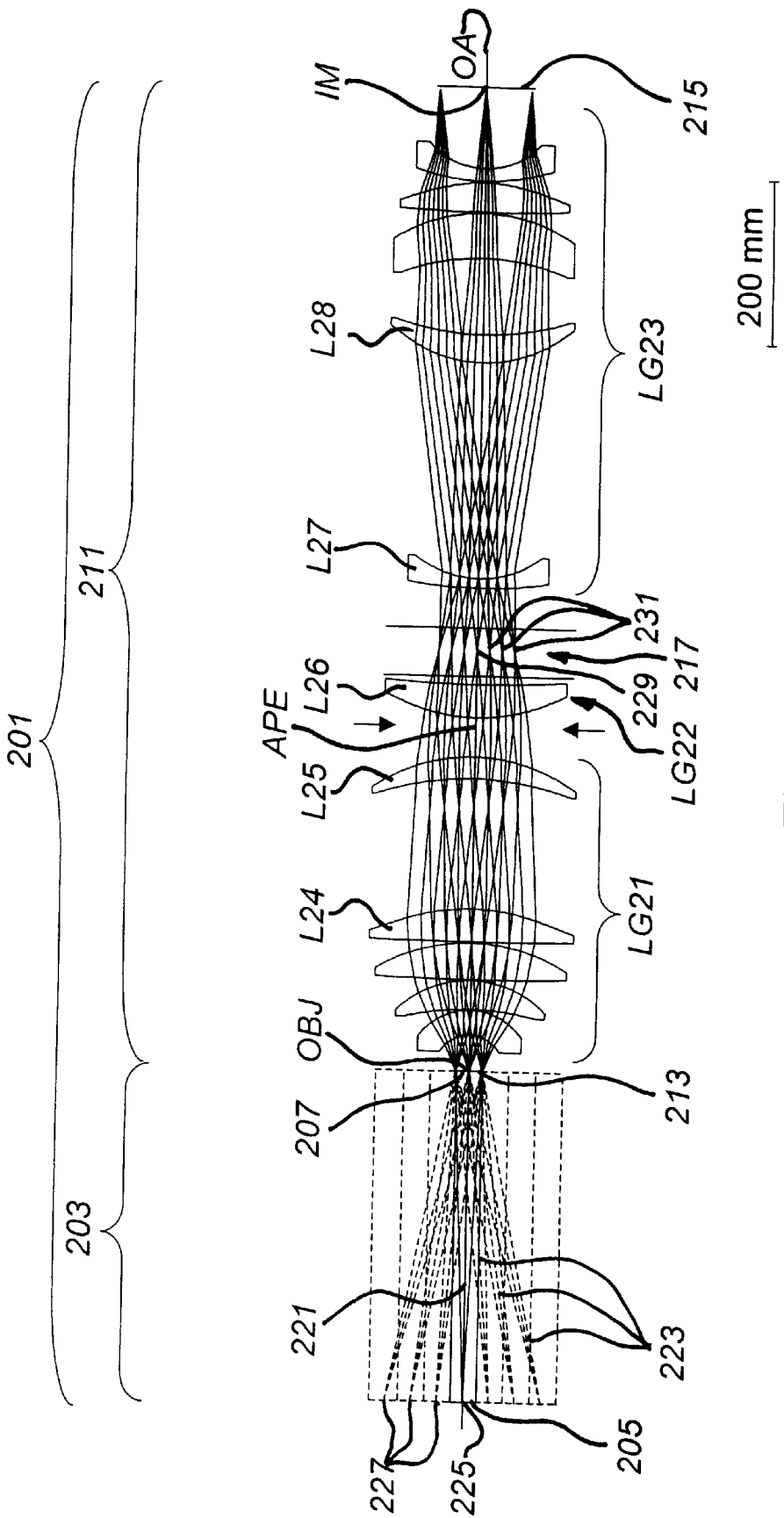
FIG. 2 shows a lens section of a first embodiment example, with a rod integrator and an objective.

A first embodiment is shown in x-z section in FIG. 2. The elements in FIG. 2 that correspond to elements in FIG. 1 have the same reference characters as in FIG. 1, increased by the number 200. Reference is made to the description of FIG. 1 for a description of these elements. A glass rod of quartz ($SiO_2$) is used as the rod integrator 203, and has a refractive index of 1.5084 at the working wavelength $\lambda$=248.3 nm. The entry surface 205 has a width of 32 mm and a height of 7 mm, so that the side aspect ratio is 4.6. The length of the rod integrator 203 is 400 mm. After the rod integrator 203 there follows the objective 211, the object plane OBJ having a defocusing of 1.0 mm with respect to the exit surface 207 of the rod integrator 203. The object 211 is constructed with rotational symmetry about the optucal axis OA. The system data are given in Table 1. The objective 211 images the object field 213 with an magnification ratio of $\beta$=−3.50 onto the image field 215. It consists here of a lens group LG21 between the object plane OBJ and the aperature plane APE, and also the lens group LG22 and LG23 between the stop plane APE and the image plane IM. The lens group LG22 has only the lens L26. The object field has a diameter of 32.4 mm. The object-side numerical aperature is 0.66.

TABLE 1

Optical Data of the Objective 211 of FIG. 2

| Lens | Surface | Radius (mm) | Size (mm) | Material | Diameter (mm) |
|---|---|---|---|---|---|
|  | OBJ | 0.00 | 44.12 |  | 32.4 |
| L21 | S202 | −42.28 | 30.35 | SiO2 | 73.0 |
|  | S203 | −78.14 | 0.90 |  | 121.7 |
| L22 | S204 | −338.66 | 37.30 | SiO2 | 163.1 |
|  | S205 | −124.59 | 0.86 |  | 177.2 |
| L23 | S206 | 2979.91 | 45.50 | SiO2 | 221.0 |
|  | S207 | −219.18 | 1.65 |  | 228.3 |
| L24 | S208 | 5302.65 | 40.00 | SiO2 | 241.5 |
|  | S209 | −230.16 | 156.30 |  | 244.0 |
| L25 | S210 | −377.28 | 26.00 | SiO2 | 241.3 |
|  | S211 | −224.20 | 40.60 |  | 195.8 |
|  | APE | 0.00 | 6.00 |  | 217.2 |
| L26 | S213 | 212.83 | 39.70 | SiO2 | 216.9 |
|  | S214 | 1296.09 | 120.30 |  | 211.7 |
| L27 | S215 | 523.30 | 11.70 | SiO2 | 166.8 |
|  | S216 | 128.28 | 148.73 |  | 155.8 |
|  | S217 | 0.00 | 113.55 |  | 240.0 |
| L28 | S218 | 146.29 | 33.90 | SiO2 | 219.7 |
|  | S219 | 345.28 | 94.30 |  | 216.2 |
| L29 | S220 | −268.89 | 55.00 | SiO2 | 208.1 |
|  | S221 | −200.89 | 0.80 |  | 216.3 |
| L210 | S222 | 1616.33 | 35.50 | SiO2 | 202.3 |
|  | S223 | −174.93 | 2.20 |  | 199.1 |
| L211 | S224 | 256.46 | 15.90 | SiO2 | 163.9 |
|  | S225 | 96.08 | 96.71 |  | 137.4 |
|  | IM | 0.00 | 0.00 |  | 113.3 |

Z: Arrow height; h: Height; R: Radius; EX: Eccentricity; Ck: Aspheric constants $$z = \frac{\frac{1}{R}h^2}{1+\sqrt{1-(1-EX)\left(\frac{1}{R}\right)^2 h^2}} + \sum_{k=1} c_k h^{2k+2}$$

| Surface | EX | C1 | C2 | C3 | C4 | C5 |
|---|---|---|---|---|---|---|
| S209 | −1.1741 | 3.9084E-08 | 3.8630E-13 | 6.5586E-17 | −3.3899E-21 | 1.2432E-25 |
| S213 | −0.2501 | −2.1870E-08 | 5.4913E-17 | −7.7358E-17 | 4.1956E-21 | −1.2014E-25 |
| S218 | 0.2356 | −3.4023E-08 | −1.0405E-12 | 7.3414E-17 | 9.7841E-21 | 3.0608E-25 |
| S223 | −0.8321 | 1.4350E-07 | −4.9565E-12 | 5.7530E-16 | −3.6123E-20 | 1.5494E-24 |

The dimensions of the rod integrator 203 are advantageously matched to the following objective 211 and to the requirements with respect to the uniformity of the intensity distribution of the field to be illuminated. The dimensions of the field to be illuminated within the circular object field 213 and also the distribution of the ray angles before the rod integrator 203 are predetermined. The field to be illuminated is usually a rectangular field that is inscribed in the object field 213. The side aspect ratio of the rod integrator 203 is then matched to the side aspect ratio of the field to be illuminated, where the side aspect ratio of the rod integrator 203 deviates slightly from the side aspect ratio of the field to be illuminated, due to the defocusing of the exit surface 207 from the object plane 213. The width of the entry surface $B_{RI}$=32 mm lies within the numerical range for the width $B_{RI}$ given by the relation (2) for an object field diameter $D_{Obj}$=32.4 mm and an aspect ratio of the rod integrator of $R_{xy}$=4.6, so that the cross section of the rod integrator 203 is optimally matched to the object field 213.

The filling factor σ can be matched between 0.36 and 1.0 by the system components arranged before the rod integrator 203. The minimum filling factor is thus σ=0.36, which corresponds to a maximum aperture of 0.24 of the beams at the entry, or exit, surface of the rod integrator 203. The number of reflections at the side surfaces of the rod integrator 203 for a ray whose ray angle to the optical axis corresponds to the maximum aperture of the illuminating rays at a minimum filling factor σ is given by the following equation:

$$\text{The number of reflections} = \frac{L_{SI} \cdot \tan\left(\arcsin\left(\frac{NA_{Obj} \cdot \sigma}{n_{SI}}\right)\right)}{B_{SI}} \quad (3)$$

In this embodiment, the number of reflections at the side surfaces is equal to 2.0. The length of the rod integrator thus lies within the numerical range given by the relation (2), which on the average requires 1.5 to 4.5 reflections.

The plane of the paper in FIG. 2 represents the x-z plane; the z-direction points in the direction of the optical axis OA, and the width of the entry surface 205 is measured in the x-direction. The real rod integrator 203 that is present is indicated by a full line. It is supplemented in the positive and negative x-direction respectively by three further, virtual rod integrators, which are drawn dashed. These are to illustrate the production of the virtual secondary light sources 227. Each further rod integrator corresponds here to a reflection at a side surface within the real rod integrator 203. The rays starting from the virtual secondary light sources 227 are drawn dashed as far as the exit surface 207 of the rod integrator 203.

The grid with the tertiary light sources, which comprises the central tertiary light source 229 and the off-axis light sources 231, is produced in the objective between the lenses L26 and L27, while the aperture plane APE is arranged between the lenses L25 and L26. The stop plane APE represents the image of the entrance pupil, situated at infinity, by the lens group LG21.

Figure 3:
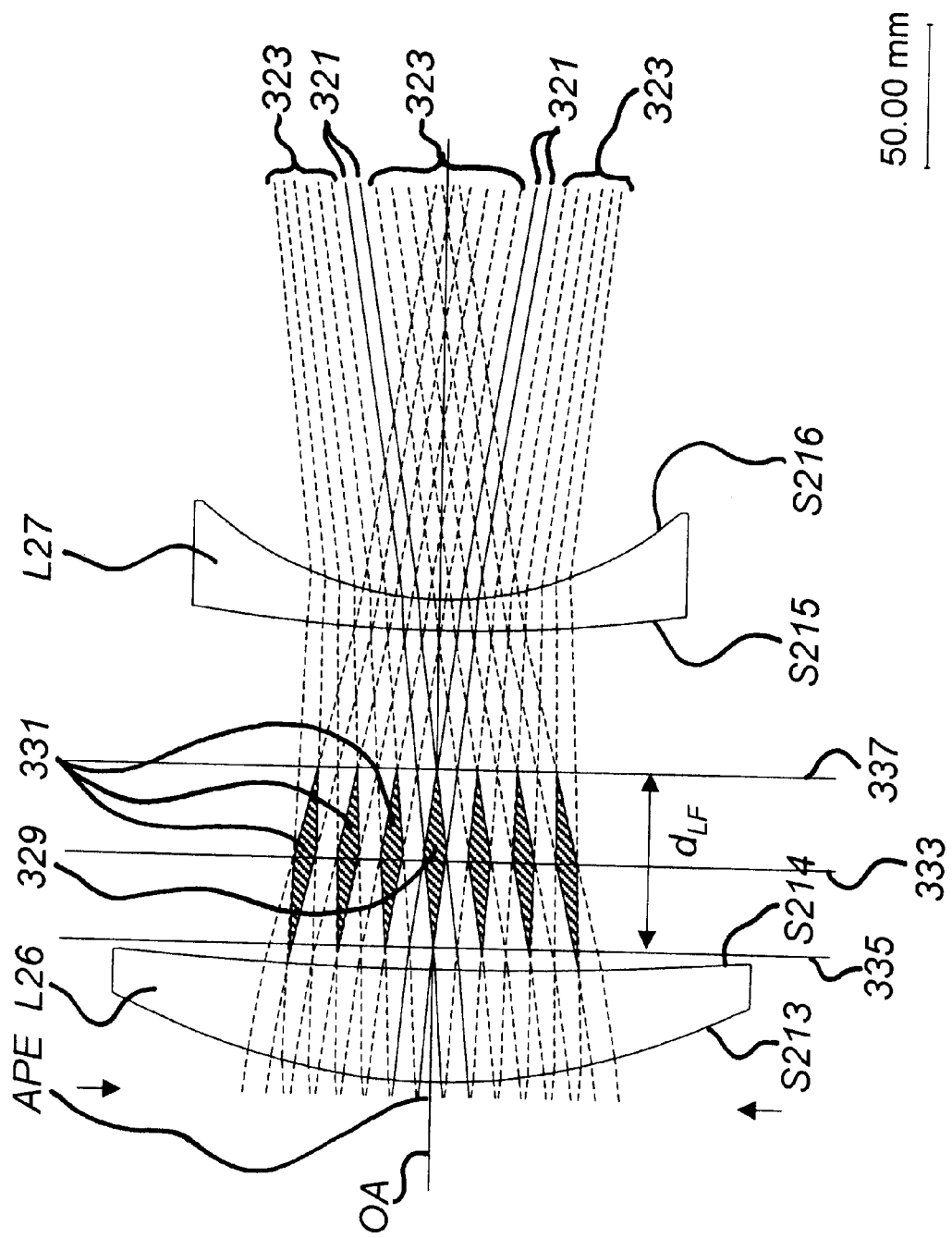
FIG. 3 shows an excerpt from the lens section of FIG. 2.

In order to be able to better describe the lens-free interspace that is arranged between the lenses L26 and L27, FIG. 3 shows an enlarged excerpt from FIG. 2. While in FIG. 2 the rays start from secondary light sources of point form, the rays drawn in FIG. 3 start from extended secondary light sources. Thus the tertiary light sources 329 and 331 are also not of point form, but are extended. They come to lie in the plane 333, which has a distance of 40 mm from the vertex of the surface S214. If the grid with the virtual secondary light sources is situated in the plane of the entry surface 205 of the rod integrator, the plane 333 is then a plane optically conjugate to the plane of the entry surface 205. Six off-axis tertiary light sources 321 are produced in addition to the central tertiary light source 329. The regions of high local intensity for the tertiary light sources 329 and 331 are marked by shading. Those rays are drawn that are relevant for the determination of the axial size of the lens-free interspace. The rays drawn only between the aperture plane APE and a surface after the lens L27 start in the entry surface of the rod integrator at the object points $P_1$ (x=−8 mm, y=0 mm) and $P_2$ (x=+8 mm, y=0 mm), or at $P_4$ (x=+16 mm, y=0 mm) and intersect the object plane of the objective at $P_3$ (x=−16 mm, y=0 mm) or $P_4$ (x=+16 mm, y=0 mm) respectively. The object points $P_1$ and $P_2$ then bound the central field in the entry surface, while the points $P_3$ and $P_4$ represent the edges of the illuminated region in the object plane, and bound the ray bundle starting from $P_1$ and $P_2$. The rays 321 drawn as full lines pass through the rod integrator without reflection at the side surfaces, and thus belong to the central tertiary light source 329. In contrast to this, the rays 323 drawn dashed are reflected one or more times at the side surfaces, and thus belong to the off-axis tertiary light sources 331. Between the planes 335 and 337, the rays 321 drawn with full lines have smaller ray heights than the rays 323 drawn dashed. The lens-free interspace, in which there are to be no lenses, is precisely defined by this condition. The plane 335 has a distance of 5 mm from the vertex of the surface S214, and the plane 337 has a distance of 69 mm from the vertex of the surface S214. The axial size $d_{LF}$ of the lens-free interspace is thus 64 mm.

Figure 4:
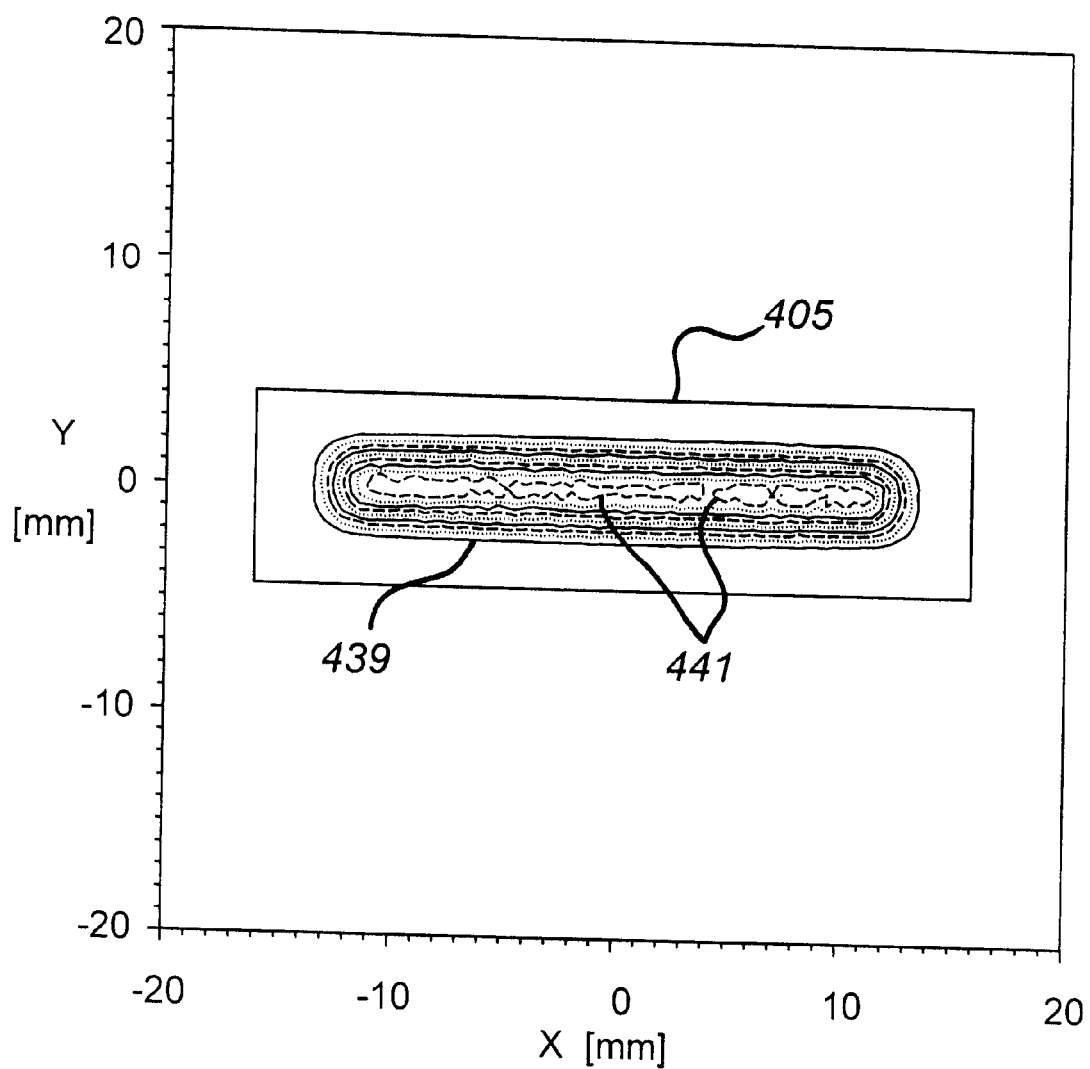
FIG. 4 shows, in a contour diagram, the illumination of the entry surface of the rod integrator.
Figure 5:
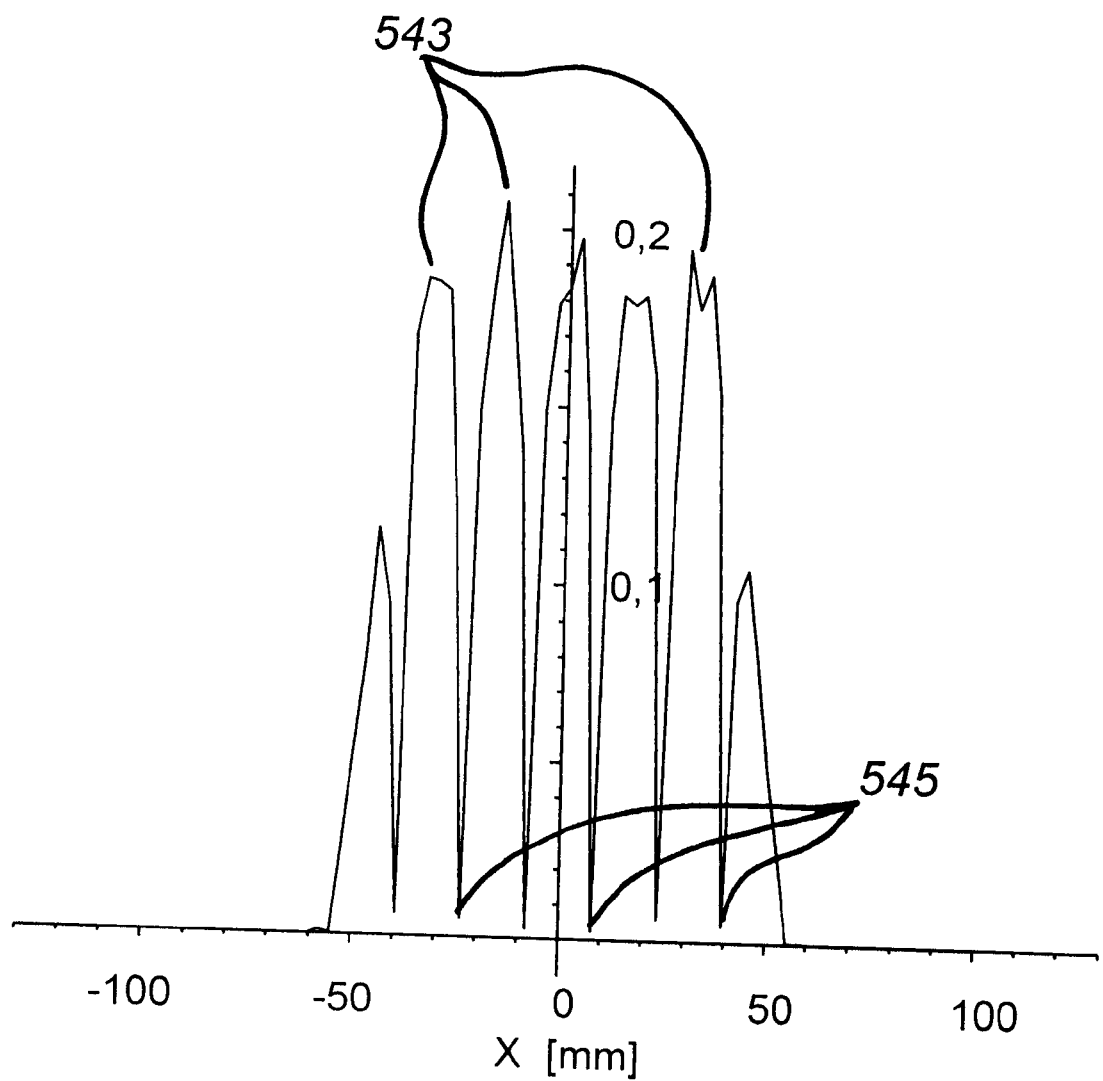
FIG. 5 shows a diagram of the intensity distribution at the place of the tertiary light sources.
Figure 6:
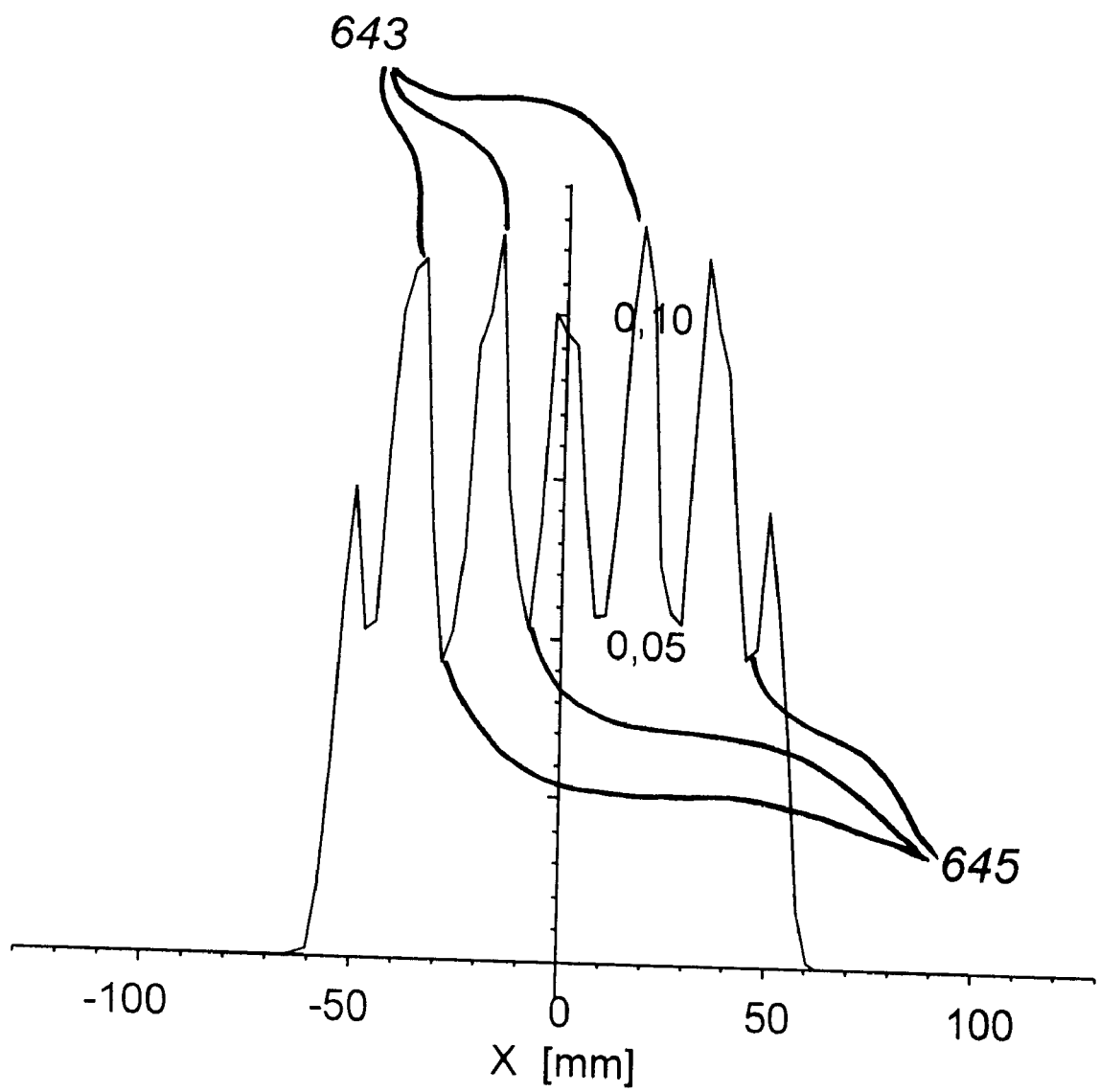
FIG. 6 shows a diagram of the intensity distribution at the edge of the lens-free interspace.

In order to be able to determine the intensity distributions within the lens-free interspace 217, and hence to demonstrate the advantages conferred by the construction of the illumination system 201 according to the invention, FIGS. 4–6 show simulation results of a load calculation in different planes of the illumination system. The illumination of the entry surface 405, which is the same as the entry surface 205 in FIG. 2, is shown in FIG. 4. The intensity distribution is shown in a contour plot. The line 439 is the 5% line of the intensity distribution, and the line 441 is the 95% line. The spacing of the 50% points in a section through the intensity distribution along the x-axis is 24 mm, while the spacing of the 50% points in a section through the intensity distribution along the y-axis is 2.7 mm. The product of these two spacings, which in this case is 30% of the entry surface, is a measure of the filling of the entry surface. The entry surface is thus markedly under-filled.

The intensity distribution in the plane 333 of FIG. 3 can be calculated, starting from the illumination distribution of FIG. 4 in the entry surface of the rod integrator and an illumination aperture of 0.3 in front of the rod integrator. FIG. 5 shows a section through the intensity distribution along the x-direction at y=0. The noise is conditioned by the limited number of calculated rays. The intensity maxima 543 result at the place of the tertiary light sources. The intensity falls off to nearly zero between the intensity maxima 543. The ratio of the intensities of the local intensity maxima 543 to the intensities of the local intensity minima 545 situated therebetween is thus nearly infinite. The energy load in the local intensity maxima 543 is up to 0.2 mJ/(pulse cm$^2$) when starting from a typical excimer laser source for lithographic applications.

FIG. 6, on the contrary, shows a section through the intensity distribution along the x-axis at y=0 mm in the plane 335 of FIG. 3, which bounds the lens-free interspace. The energy load in the local intensity maxima 643 is only 0.2 mJ/(pulse cm$^2$), and is thus smaller by a factor of 2. The ratio of the intensities of the local intensity maxima to the intensities of the local intensity minima 645 situated therebetween is only 2.0 in the plane 335. The energy load is thus markedly reduced outside the lens-free interspace.

The lens L26, which is a meniscus lens with positive refractive power, is situated in the objective 211 of FIG. 2, between the stop plane APE and the lens-free interspace 217. The lens L26 has a distance of 6.0 mm from the aperture plane APE. The convex lens surface S213 facing toward the stop plane APE has an aspheric surface shape, the surface parameters of which are given in Table 1. Spherical aberrations can be corrected very well by the lens 216 with an aspheric lens surface S213, since it is arranged close to the aperture plane APE. Moreover, the aspheric surface makes it possible to save correction means, so that a gas-filled air space with an axial size of 120.3 mm results between the lenses L26 and L27.

In the objective 211, each object point of the object field 213 is focused to a respective spot image in the image plane IM. Within the image field, the maximum diameter of the spot images is 260 μm, for all the spot images. This value corresponds to 0.2% of the image field diameter of 113.3 mm.

Figure 7:
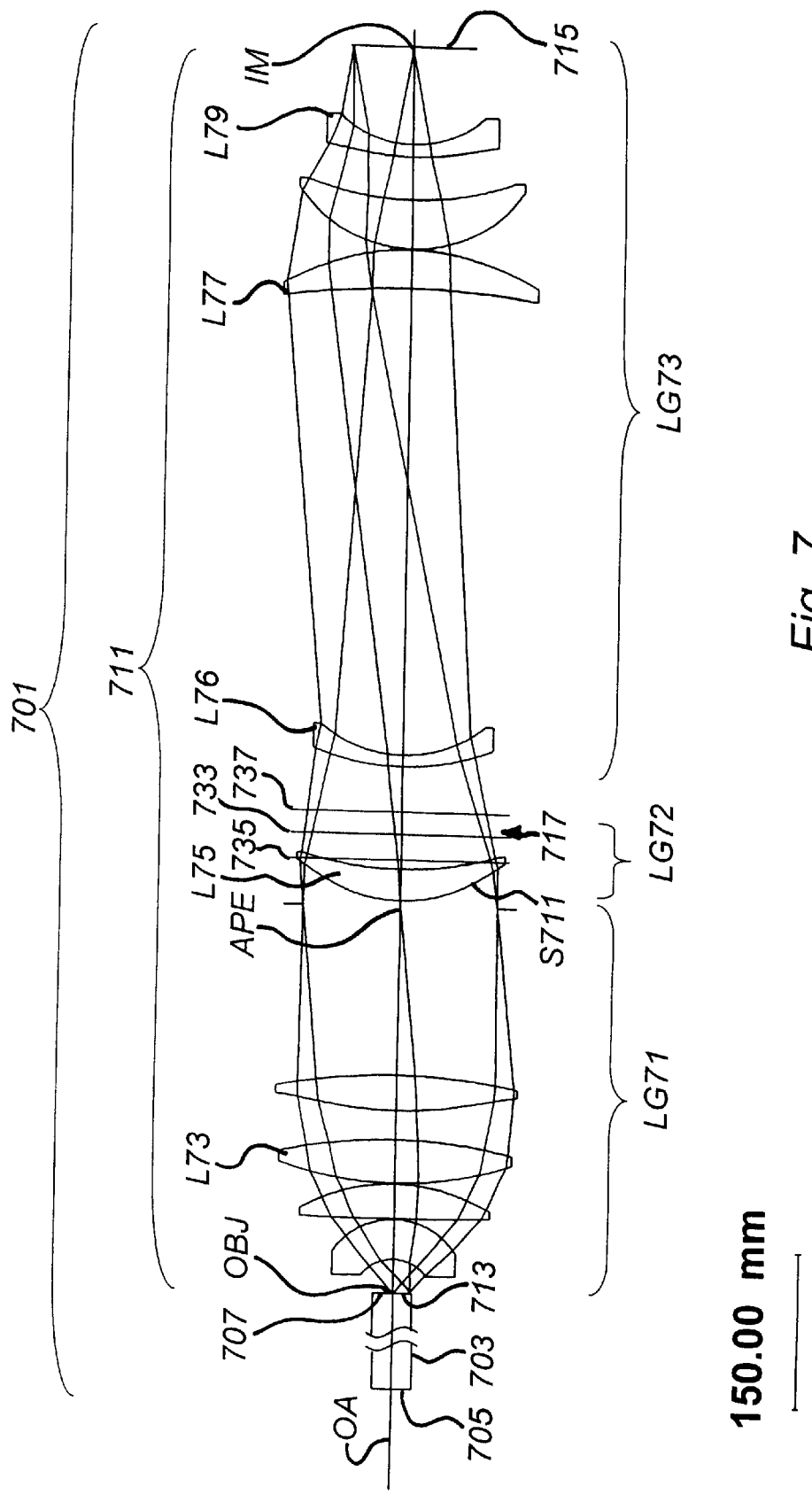
FIG. 7 shows a lens section of a second embodiment example, with a rod integrator and an objective.

A second embodiment example is shown in FIG. 7 in x-z section. The elements in FIG. 7 corresponding to the elements of FIG. 2 have the same reference characters as in FIG. 2, increased by the number 500. Reference is made to the description of FIG. 2 for a description of these elements. A glass rod of calcium fluoride crystal (CaF$_2$) is used as the rod integrator 703, and has a refractive index of 1.5014 at the working wavelength λ=193.3 nm. The entry surface 705 has a width of 30 mm and a height of 10 mm, so that the side aspect ratio is 3.0. The length of the rod integrator 703 is 500 mm. The rod integrator 703 is shown abbreviated in FIG. 7. After the rod integrator 703 there follows the objective 711, the object plane 713 having a defocusing of 0.8 mm with respect to the exit surface 707 of the rod inegrator 703. The objective 711 is constructed with rotational symmetry about the optical axis OA. The system data are given in Table 2. As lens materials, there are used calcium fluoride crystal (CaF$_2$) and quartz (SiO$_2$), which have respective refractive indices of 1.5014 and 1.5603 at the working wavelength of λ=193.3 nm. The objective 711 images the object field 713 with an magnification ratio of β=−3.74 onto the image field 715. It consists here of a lens group LG71 between the object plane OBJ and the stop plane APE, and also the lens groups LG72 and LG73 between the aperture pland APE and the image plane IM. The object field has a diameter of 31.2 mm. The object-side numerical aperature is 0.66. The entrance pupil of the objective 711 is situated at infinity

TABLE 2

Optical Data of the Objective 711 of FIG. 7

| Lens | Surface | Radius (mm) | Size (mm) | Material | Diameter (mm) |
|------|---------|-------------|-----------|----------|---------------|
|      | OBJ     | 0.00        | 32.95     |          | 31.2          |
| L71  | S702    | −38.69      | 37.88     | CaF2     | 61.9          |
|      | S703    | −73.41      | 0.90      |          | 114.4         |
| L72  | S704    | 2696.07     | 33.32     | CaF2     | 168.2         |
|      | S705    | −191.13     | 0.90      |          | 178.0         |
| L74  | S706    | 329.78      | 41.98     | SiO2     | 216.0         |
|      | S707    | −514.77     | 28.53     |          | 219.1         |
| L75  | S708    | 334.07      | 34.03     | SiO2     | 227.6         |
|      | S709    | −570.33     | 161.49    |          | 227.6         |
|      | APE     | 0.00        | 6.00      |          | 188.0         |
| L76  | S711    | 130.20      | 30.35     | SiO2     | 195.8         |
|      | S712    | 324.12      | 99.95     |          | 192.5         |
| L77  | S713    | 211.39      | 11.40     | SiO2     | 168.8         |
|      | S714    | 127.10      | 230.32    |          | 158.8         |
|      | S715    | 0.00        | 216.90    |          | 197.4         |
| L78  | S716    | −851.36     | 37.33     | SiO2     | 237.1         |
|      | S717    | −237.99     | 0.90      |          | 240.0         |
| L79  | S718    | 133.05      | 46.59     | SiO2     | 212.7         |
|      | S719    | 275.70      | 42.03     |          | 200.4         |
| L710 | S720    | 240.69      | 12.00     | SiO2     | 162.1         |
|      | S721    | 101.80      | 91.62     |          | 138.5         |
|      | IM      | 0.00        | 0.00      |          | 116.2         |

Z: Arrow height; h: Height; R: Radius; EX: Eccentricity; Ck: Aspheric constants $$z = \frac{\frac{1}{R}h^2}{1 + \sqrt{1 - (1-EX)\left(\frac{1}{R}\right)^2 h^2}} + \sum_{k=1} c_k h^{2k+2}$$

| Surface | EX      | C1           | C2           | C3           | C4          | C5          |
|---------|---------|--------------|--------------|--------------|-------------|-------------|
| S708    | −2.4978 | −4.3481E−08  | −7.8594E−14  | −2.0935E−17  | 2.0935E−17  | 8.6082E−23  |
| S711    | 0.2840  | −4.1616E−08  | −1.1523E−12  | −4.8136E−18  | 4.8136E−18  | −5.8384E−21 |
| S713    | 0.6222  | −3.5043E−08  | 1.0875E−12   | 2.1557E−16   | 2.1557E−16  | −3.0608E−25 |
| S720    | 0.9715  | −5.9896E−08  | −2.8284E−12  | 1.2407E−16   | 1.2407E−16  | 2.9936E−21  |

The dimensions of the entry surface 705 of the rod integrator 703 are matched to the side aspect ratio of the illuminated field and to the diameter of the object field 713. The width of the entry surface $B_{RI}$=30 mm at an object field diameter $D_{Obj}$=31.2 mm and an aspect ratio of the rod integrator $R_{xy}$=3.0 is within the numerical range given by the relation (2) for the width $B_{RI}$.

The filling factor σ can be matched between 0.27 and 1.0 by the components arranged before the rod integrator 703. The minimum filling factor is thus σ=0.27, which corresponds to a maximum aperture of 0.18 of the rays at the respective entry or exit surface of the rod integrator 703. For a ray with this aperture angle, the number of reflections at the side surfaces of the rod integrator 703 is equal to 2.0 according to equation (3). The length of the rod integrator thus lies within the numerical range given by the relation (2).

The grid with the tertiary light sources is produced in the objective 711 between the lenses L75 and L76 in the plane 733, while the stop plane APE is arranged between the lenses L74 and L75. The distance from the plane 733 with the tertiary light sources to the lens L75 is 29 mm. The plane 733 is situated conjugate to the plane of the real secondary light source, which in this embodiment example is situated at the place of the entry surface 705. Between the planes 735 and 737, all rays that start within the entry surface from a central field with a field width of 15 mm and with a field height of 5 mm, and are not reflected at the side surfaces of the rod integrator 703 have smaller ray heights with respect to the optical axis OA than all rays that come from the same central field and are reflected one or more times. In the objective 711, the distance between the lens L75 and the plane 737 is 7 mm, and the distance between the lens L75 and the plane 735 is 67 mm. The axial size of the lens-free interspace is thus 60 mm.

The lens L75 is a meniscus lens with positive refractive power, is situated between the aperture plane APE and the lens-free interspace 717. The lens L75 has a distance of 6.0 mm from the stop plane APE. The convex lens surface S714 facing toward the aperture plane APE has an aspheric surface shape, the surface parameters of which are given in Table 2.

In the objective 711, each object point of the object field 713 is focused to a respective spot image in the image plane IM. Within the image field 715, the maximum diameter of the spot images is 240 μm, for all the spot images. This value corresponds to 0.2% of the image field diameter of 116.3 mm.

Figure 8:
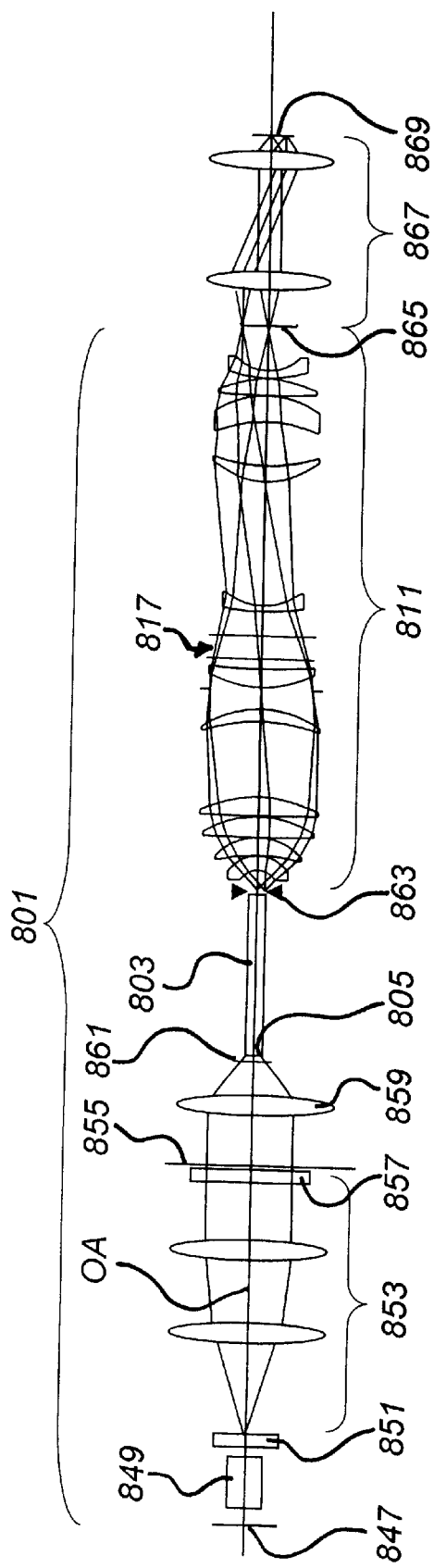
FIG. 8 shows a schematic diagram of a microlithographic projection exposure apparatus.

FIG. 8 is a schematic diagram showing a first embodiment of a microlithographic projection exposure apparatus. As a light source 847 there can be used, among others, a DUW or VUV excimer laser, for example, a KrF laser for 248 nm, an ArF laser for 193 nm, a F₂laser for 157 nm, an Ar₂ laser for 126 nm, and a NeF laser for 109 nm. A KrF laser for 248 nm is used in the embodiment example of FIG. 8. A parallel light bundle is formed by a beam forming optics 849, and falls on an optical element 851 that increases divergence. A raster plate of diffractive or refractive raster elements can, for example, be used as the element 851 that increases divergence. Each raster element produces a ray bundle whose angular distribution is determined by the extent and focal length of the raster element. The raster plate is located in the object plane of a following objective 853, or near to it. The ray pencils produced by the raster elements are superposed in the stop plane 855 of the objective 853. The objective 853 can be designed as a zoom objective, in order to vary the extension of the illumination of the aperture plane 855 and thus the filling degree σ. By the use of two axicon lenses that are displaceable along the optical axis, directly before the aperture plane 855, an annular illumination with variable ring width can also be attained. Such a zoom axicon objective is known from German Patent Document DE 44 41 947 A. The extent of the illuminated area in the aperture plane 855, and with it the degree of filling σ, can likewise be varied by exchanging the aperture-producing element 851. Special aperture-producing elements 851 also permit the so-called quadrupole illumination with four separate regions. A further divergence-increasing optical element 857 is arranged in the aperture plane 855. A raster plate of diffractive or refractive raster elements can, for example, be used as the divergence-increasing element 857. Each raster element produces a ray bundle whose angular distribution is determined by the extent and focal length of the raster element. The raster elements have a rectangular external shape, the side aspect ratio of which is matched to the side aspect ratio of the entry surface 805 of the rod integrator 803. The angular distribution produced by the divergence-increasing optical element 857 is transformed into a spatial distribution by the incoupling objective 859 and the ray pencils produced by the raster elements are supported by the incoupling objective 859, so that a real secondary light source is produced immediately in front of the entry surface 805 of the rod integrator 803. Due to the rectangular shape of the raster elements, the real secondary light source likewise has a rectangular external shape. The resulting distribution of illumination is shown in FIG. 4. A diffusing plate 861 is arranged before the rod integrator. After the rod integrator there follows the masking device 863 that is embodied with displaceable mechanical blades in order to vary the size of the illuminated field within the object field of the following objective 811. The rod integrator 803 and the objective 811 are identical to the components of the first embodiment, as described in FIGS. 2–6, the descriptions thereof, and Table 1. The objective 811 is designated as a "REMA objective", since it images the masking device 863 onto the reticle 865 that is arranged in the image plane of the REMA objective 811. The REMA objective 811 has, besides the good imaging property that is expressed in a maximum diameter of spot images of only 260 μm, the further property that the exit pupil of the REMA objective 811 is matched to the entrance pupil of the following projection objective 867. This is difficult when the projection objective 867 has a field-dependent entrance pupil. Such illumination systems are expressly described in U.S. Pat. No. 6,285,443. The projection objective of FIG. 8 of German Patent Document DE 199 42 281.8, which has an imaging scale of −0.25, can be used for the projection objective 867 shown only schematically in FIG. 8. The system data are given in Table 4 of German Patent Document DE 199 42 281.8, with the distance between the object plane and the vertex of the lens L401 being 33.4557 mm. The projection objective 867 images the reticle onto the photosensitive substrate 869, the so-called wafer.

The embodiments show the possibility of providing illumination systems that have a rod integrator and a following objective, with the dimensions of the rod integrator being taken into account in the design of the objective in order to prevent materials damage to the lenses of the objective due to local intensity peaks. This was attained in that the REMA objectives known from U.S. Pat. No. 5,982,558 and German Patent Document DE 196 53 983 A1 (U.S. patent application Ser. No. 09/125,621) were improved by a lens-free interspace in a plane within the REMA objective conjugate to the entry surface of the rod integrator. The invention is thus distinguished from the prior art, in that the rod integrator and the following objective are considered as a functional unit.

What is claimed is:

1. An illumination system with an optical axis, comprising:

a rod integrator having an entry surface and an exit surface, and an objective for imaging an object field onto an image field, said objective being arranged after said rod integrator in a direction of light propagation, wherein a lens-free interspace is situated in said objective, a plane optically conjugate to a plane of said entry surface is situated within said lens-free interspace, and said lens-free interspace has an axial length along said optical axis of at least 30 mm.

2. An illumination system with an optical axis, comprising:

a rod integrator having an entry surface, an exit surface, a width, a height, and reflecting side surfaces, and an objective for imaging an object field onto an image field, said objective being arranged after said rod integrator in a direction of light propagation, wherein a lens-free interspace is situated in said objective,
within said lens-free interspace, first rays have first ray heights with respect to said optical axis, and second rays have second ray heights with respect to said optical axis, wherein the first ray heights have lower absolute values than the second ray heights,
said second rays are reflected at said reflecting side surfaces of said rod integrator, and said first rays are not reflected at said reflecting side surfaces of said rod integrator,
all said first rays and all said second rays start from a central field within said entry surface of said rod integrator, and
said central field has a field width and a field height,
the ratio of said field width to said width of said entry surface is at most 0.7, and the ratio of said field height to said height of said entry surface is at most 0.7.

3. The illumination system according to claim 2,
wherein said lens-free interspace has an axial length along said optical axis of at least 30 mm.

4. The illumination system according to claim 1,
wherein said objective has a diameter of said object field and an object side numerical aperture, said diameter of said object field being between 15 mm and 40 mm and said object-side numerical aperture being between 0.4 and 0.75.

5. The illumination system according to claim 1,
with a diameter $D_{Obj}$ of said object field,
a side aspect ratio $R_{xy}$ which is the quotient of a width $B_{RI}$ and a height of said entry surface and has values between 1 and 5,
a length $L_{RI}$ of said rod integrator along said optical axis,
a filling factor σ, which gives the quotient of a maximum sine of angles of all the rays in respect to said optical axis at said entry surface and said object-side numerical aperture, and has values between 0.2 and 1.0, and a refractive index $n_{RI}$ within said rod integrator with values between 1.0 and 1.8, wherein said width Be has values in the range $$0.8 \cdot Du_{Obj} \cdot \sqrt{1 + \frac{1}{R_{xy}^2}} < B_{SI} < 1.2 \cdot Du_{Obj} \cdot \sqrt{1 + \frac{1}{R_{xy}^2}}$$

and said length $L_{RI}$ has values in the range $$1.5 \cdot \frac{B_{SI}}{\tan\left(\arcsin\left(\frac{NA_{Obj} \cdot \sigma}{n_{SI}}\right)\right)} < L_{SI} < 4.5 \cdot \frac{B_{SI}}{\tan\left(\arcsin\left(\frac{NA_{Obj} \cdot \sigma}{n'_{SI}}\right)\right)}.$$

6. The illumination system according to claim 1, wherein said rod integrator has a length between 350 mm and 800 mm.

7. The illumination system according to claim 1, wherein said objective has an entrance pupil that is situated at infinity.

8. The illumination system according to claim 1, wherein said objective has a aperture plane, and at least one lens situated between said aperture plane and said lens-free interspace.

9. The illumination system according to claim 8, wherein said at least one lens has a distance to said aperture plane smaller than 30 mm.

10. The illumination system according to claim 8, wherein said at least one lens has an aspheric lens surface.

11. The illumination system according to claim 8, wherein exactly one lens is situated between said aperture plane and said lens-free interspace.

12. The illumination system according to claim 1, having a side aspect ratio given as the quotient of a width and a height of said entry surface, wherein said side aspect ratio is at least 2.

13. The illumination system according to claim 1, wherein said image field has a diameter, said objective produces a spot image within said image field of each object point within said object field, and the diameter of said spot images is at most 1% of the diameter of said image field.

14. The illumination system according to claim 1, wherein said illumination system includes as a light source an excimer laser for production of UV rays with wavelengths smaller than 250 nm.

15. The illumination system according to claim 1, wherein said objective is a REMA objective for imaging a masking device onto a reticle, said masking device is arranged in said object plane of said REMA objective, and said reticle is arranged in said image plane of said REMA objective.

16. A microlithographic projection exposure apparatus, comprising:

an illumination system according to claim 15, and a projection objective that images said reticle onto a photosensitive substrate.

17. The illumination system according to claim 1, wherein said axial length is at least 50 mm.

18. The illumination system according to claim 2, wherein a ratio of said field width to said width of said entry surface is at most 0.5.

19. The illumination system according to claim 2, wherein a ratio of said field height to said height of said entry surface is at most 0.5.

20. The illumination system according to claim 3, wherein said axial length is at least 50 mm.

21. The illumination system according to claim 9, wherein said distance to said aperature plane is smaller than 10 mm.

* * * * *